United States Patent
Konno

(10) Patent No.: US 6,608,583 B1
(45) Date of Patent: Aug. 19, 2003

(54) ANALOG SIGNAL INPUT CIRCUIT IN ANALOG SIGNAL PROCESSING APPARATUS

(75) Inventor: Takashi Konno, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/134,592

(22) Filed: Apr. 30, 2002

(51) Int. Cl.[7] ................................. H03M 1/12
(52) U.S. Cl. ........................ 341/155; 341/124
(58) Field of Search ........................... 341/155, 118, 341/163, 126, 131, 124

(56) References Cited

U.S. PATENT DOCUMENTS 4,982,191 A * 1/1991 Ohta ........................ 341/155

FOREIGN PATENT DOCUMENTS

JP 2001-45325 2/2001

* cited by examiner

Primary Examiner—Brian Young
(74) Attorney, Agent, or Firm—Rabin & Berdo, P.C.

(57) ABSTRACT

An analog signal input circuit having sample-hold circuit that is constituted by a switched capacitor amplifier for which the gain is controlled according to the capacitance ratio of the plurality of capacitors connected with a switch group, for which the opening and closing is controlled according to the amplification rate setting command. The clamping voltage of a clamping circuit included in the analog signal input circuit is established in compliance with an amplification rate setting command.

14 Claims, 5 Drawing Sheets

ANALOG SIGNAL INPUT CIRCUIT IN ANALOG SIGNAL PROCESSING APPARATUS

BACKGROUND OF THE INVENTION

1. Field of the Invention

The present invention relates to an analog input circuit to be used as an input stage of an analog signal processing apparatus such as a display device for displaying a video image by receiving a video signal.

2. Description of the Related Art

A conventional video input circuit for a video signal processing apparatus, as an analog signal input circuit, generally has the constitution shown in a block diagram in FIG. 1. In other words, such an analog/digital converting circuit comprises a clamping circuit 11, amplifying circuit 12, low pass filter 13, and sample-hold and analog/digital converter 14.

An input video signal (VIN) and signals for the clamp setting voltage (VRCL) and clamp pulse (CLP) are input to the clamping circuit 11. Moreover, the input video signal (VIN) is supplied via a capacitor (not shown) to the clamping circuit 11.

The clamping circuit 11 is a circuit for clamping the input video signal to a certain voltage for a prescribed period. In other words, the clamping circuit 11 outputs the input video signal (VIN) as a video signal clamped to the clamp setting voltage (VRCL) just for the period designated by the clamp pulse (CLP).

The video signal clamped by the clamping circuit 11 is applied to the non-inverting input terminal of the amplifying circuit 12. The amplifying circuit 12 comprises an operational amplifier and a plurality of resistors and switches. One end of each of the plurality of resistors is connected to the clamp setting voltage (VRCL) through the switches. Moreover, the clamp setting voltage (VRCL) is generated by the resistance division of two reference voltages, not shown, for determining the conversion range of the sample-hold and analog/digital converter 14. The plurality of resistors and switches have the function of adjusting the amplification rate of the amplifying circuit 12. The output of the amplifying circuit 12 is supplied to the sample-hold and analog/digital converter 14 through the low pass filter 13.

The sample-hold and analog/digital converter 14 is a circuit for sample holding the analog signal supplied from the low pass filter 13 in response to a prescribed sampling clock train, and then generating digital data expressing the amplitude of the sample-held analog signal.

It is to be understood the amplitude of a video signal varies depending on its circumstance such as TV tuner, VTR and disc player. However, the analog/digital conversion range of the sample-hold and analog/digital converter 14 is self-determined. In the analog/digital converting circuit of FIG. 1, the level of amplification A becomes no more than one because the level of amplification A of the amplifying circuit 12 is determined with the following relationship according to resistance values R1 and RN constituting the resistor group.

$$A = 1 + (R1/RN)$$

Consequently, it is a problem a video signal having an amplitude of, for example, 1.5 V or greater cannot be processed with a conventional input circuit when the analog/digital conversion range of the sample-hold and analog/digital converter 14 is up to 1.5 V. Especially for new image recording media such as DVD (digital versatile disc), the amplitude of the video signal tends to be diversified and it is necessary to contrive countermeasures for that.

For the so-called pipeline analog/digital converter, which is noteworthy as the latest analog/digital converter for video signal processing, it is often the case that the analog/digital converting range is 1.0 V. Meanwhile, the amplitude of conventional, standard video signals is about 1.3 V and therefore a problem is that those conventional, standard video signals cannot be connected to the pipeline analog/digital converter without an appropriate level adjustment.

Furthermore, in a conventional analog/digital converting circuit, the clamp setting voltage (VRCL) is used as the reference voltage for the amplifying circuit 12 and that voltage and the amplified output of the video signal are connected through the resistor group of the amplifying circuit 12. As a result, it is a problem that changes in the amplified output of the video signal influences the clamp setting voltage (VRCL) and the clamp level in the clamping circuit 11 changes.

SUMMARY OF THE INVENTION

The present invention was made in order to solve such problems, and it is an object of the present invention to provide an analog signal input circuit for analog signal processing with which the amplification rate of the analog signal can be set to one or less and a stabilized clamping voltage is attained.

The analog input circuit according to the present invention comprises: a clamping circuit for clamping the amplitude of the input analog signal according to a clamping voltage setting signal; a sample-hold circuit for amplifying, and sampling and holding the output signal from the above-mentioned clamping circuit at the prescribed amplification rate; and an analog/digital converter for generating digital data expressing the amplitude of the output signal from the above-mentioned sample-hold circuit;

wherein the above-mentioned sample-hold circuit comprises a switch capacitor type of amplifier provided with a plurality of capacitors connected with a switch group, for which the opening and closing is controlled according to an amplification rate setting command, provided as input side capacitors or feedback side capacitors; and the above-mentioned prescribed amplification rate is established according to the capacitance ratio of the above-mentioned input side capacitors and feedback side capacitors based on the above-mentioned setting command; and wherein the above-mentioned clamping circuit generates the above-mentioned clamping voltage setting signal, so that the central value of the amplitude of the output signal of the above-mentioned sample-hold circuit becomes the central voltage of the conversion range of the above-mentioned analog/digital converter according to the above-mentioned setting command.

DESCRIPTION OF THE PREFERRED EMBODIMENTS

Figure 1:
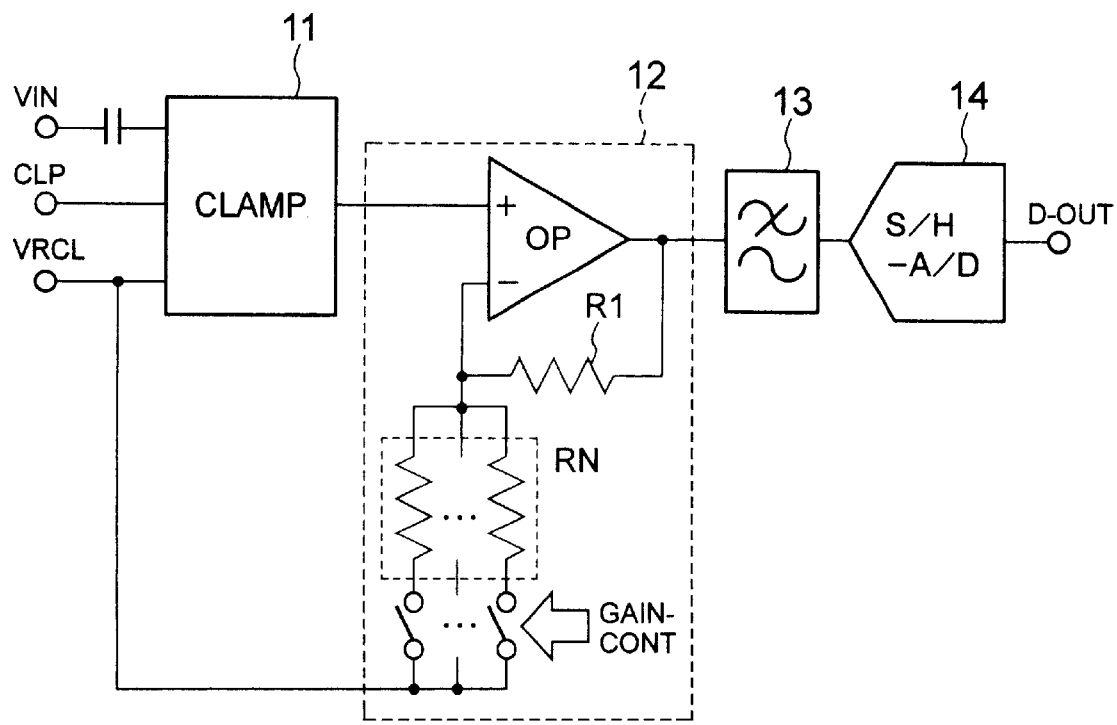
FIG. 1 is a block diagram showing the constitution of a conventional analog signal input circuit.
Figure 2:
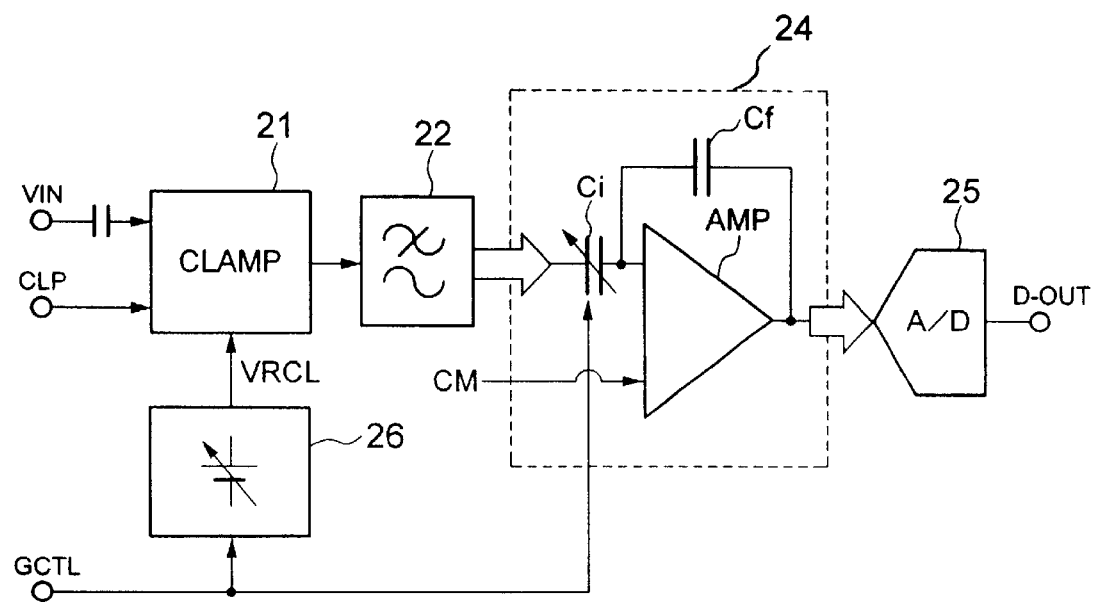
FIG. 2 is a block diagram showing an embodiment of the analog input circuit for analog signal processing according to the present invention.

FIG. 2 is a block diagram showing an embodiment of an analog signal circuit such as an analog video signal input circuit according to the present invention.

An analog video signal input circuit according to the present invention comprises a clamping circuit 21, a low pass filter 22, a chopper amp sample-hold circuit (hereinafter "sample-hold circuit") 24, an analog/digital converter 25, and a clamping voltage generating circuit 26.

An input composite video signal (VIN) and clamp pulses (CLP) are respectively supplied to the clamping circuit 21. Moreover, the input composite video signal (VIN) is supplied to the clamping circuit 21 via a capacitor (not shown).

In the clamping circuit 21, the synchronizing signal tip level (tip of sync level) and the pedestal level (pedestal level) of the input video signal (VIN) are clamped to a clamp setting voltage (VRCL) for the period when the clamp pulse (CLP)takes a high level. In effect, the clamping circuit 21 produces the video component of the composite video signal (VIN) as differences from the above-mentioned clamp setting voltage (VRCL). This clamp setting voltage (VRCL) is generated based on the amplification rate selection signal (GCTL) in the clamping voltage generating circuit 26. Moreover, the operation of the clamping voltage setting circuit 26 is discussed in detail hereinafter.

The output signal from the clamping circuit 21 is supplied to the sample-hold circuit 24 through the low pass filter 22. The sample-hold circuit 24 comprises an operational amplifier and an adjustable input capacitor and a feedback capacitor. The constitution is such that the amplification rate of the operational amplifier included in the sample-hold circuit 24 is adjusted by adjusting the capacitance of the input adjustable capacitor in response to the amplification rate selection signal (GCTL).

After being amplified at the prescribed amplification rate, the signal supplied to the sample-hold circuit 24 is sampled and held in response to the sampling clocks ö and is supplied to the analog/digital converter 25. The analog/digital converter 25 generates a digital signal of 12 bit or 16 bit, for example, representing the amplification of such an analog signal and transfers the digital signal to a video signal processing circuit (not shown) connected to this circuit.

The details of the constitution of the sample-hold circuit 24 will be explained hereinbelow with reference to the circuit diagram in FIG. 3.

As shown in the drawing, the sample-hold circuit 24 comprises input terminals IN1 through IN5, output terminals OUT1 and OUT2, switches S1 through S10, switch groups SWG, capacitors C1A through CnA, capacitors C1B through CnB, and a dual input/output operational amplifier AMP. The operational amplifier AMP is, for example, constituted by a pair of parallel operational amplifiers and amplifies input voltages supplied to the input terminals IN(+) and IN(−), respectively.

The video signals sent through the low pass filter 22 are complementary to each other and applied across the input terminals IN1 and IN2, i.e., VIN(+) and VIN(−), respectively. The so-called common mode voltage (CM) is applied to the input terminals IN3 and IN5. The common mode voltage (CM) is the value showing the central voltage value of the analog/digital conversion range in the succeeding analog/digital converter 25. Furthermore, the amplification rate selection signal (GCTL) is supplied to the input terminal IN4. The amplification rate selection signal (GCTL) is the signal for individually controlling each of the gates of the switch group SWG and is supplied from the control circuit (not shown) so that the sample-hold circuit 24 ensures the appropriate amplification rate.

The amplified outputs of the operational amplifier AMP appear at the output terminals OUT1 and OUT2 as VOUT (+) and VOUT(−) respectively.

The switches S1 through S10 are analog switches such as MOSFETs each receiving an ON/OFF control signal at its gate. The sampling clock train ö or ö[overbar] is supplied from the control circuit, not shown, as a control signal for these switches S1 through S10. Each switch becomes on when the clock pulse ö or ö [overbar] takes a high level and becomes off when those signals take low level. The switch group SA1–SAn and SB1–SBn are similar switching elements and each of the switches becomes on and off according to the amplification rate selection signal (GCTL) supplied to each gate.

The capacitors C1A through CnA and the capacitors C1B through CnB are combined with the operational amplifier AMP and constitute a so-called switch capacitor amplifying circuit. In embodiments, various values may be used as the capacitance of these capacitors.

Moreover, in the switched capacitor amplifying circuit, the capacitor C1A or C1B corresponds to a capacitor constituting a so-called feedback branch (hereinafter, simply "feedback side capacitor"). The capacitors C2A through CnA or the capacitors C2B through CnB correspond to capacitors constituting a so-called input branch (hereinafter, simply "input side capacitors"). The amplification rate of the switched capacitor amplifying circuit is then defined as C2A through CnA/C1A, or C2B through CnB/C2A.

Figure 3:
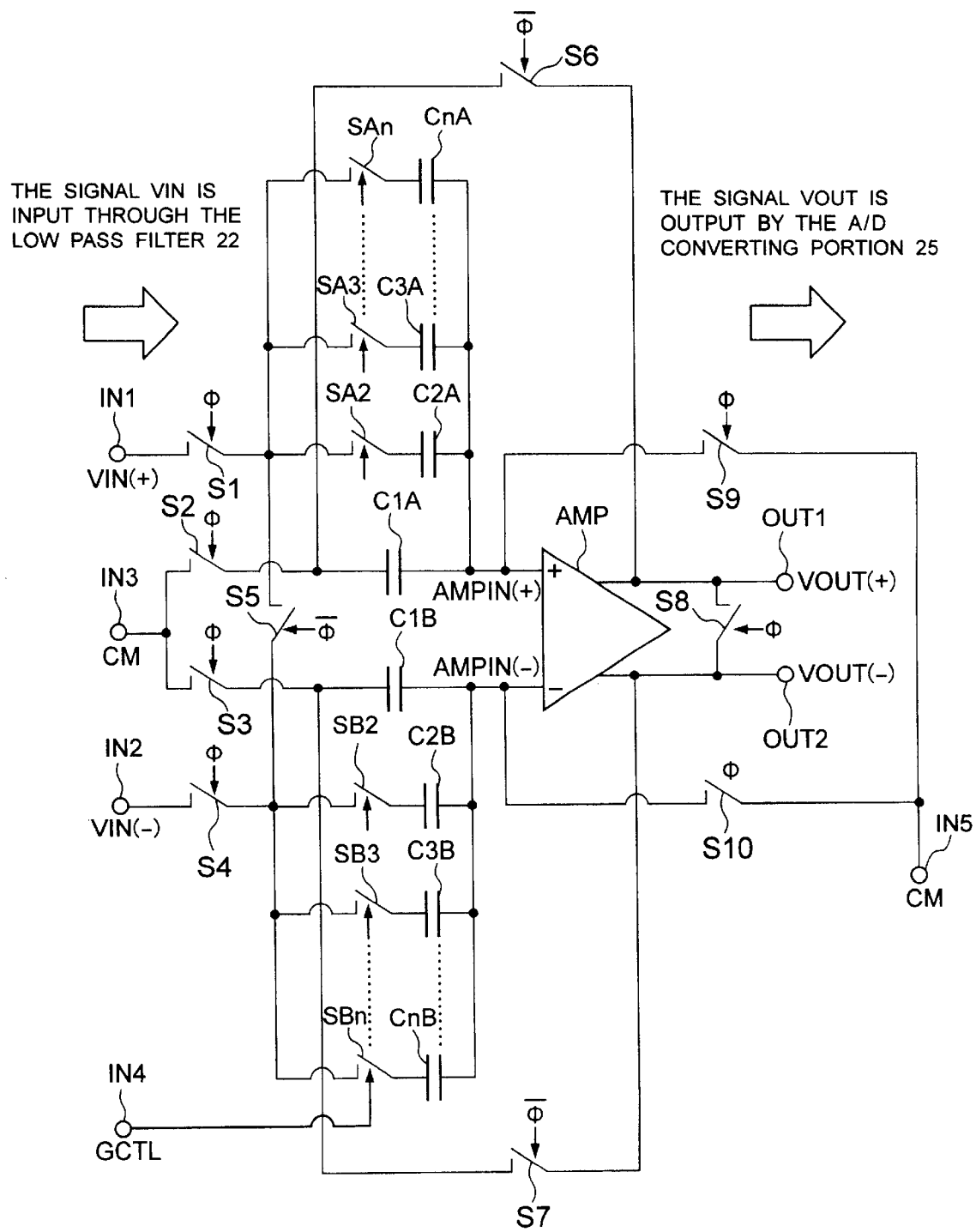
FIG. 3 is a circuit diagram showing the constitution of a chopper-type sample-hold circuit in the embodiment shown in FIG. 2.

The connections of each portion of the circuit in FIG. 3 are explained hereinbelow.

The input terminal IN1 is connected to one end of the switch S1; the input terminal IN2 is connected to one end of the switch S4; and the input terminal IN3 is connected to one end of the switch S2 and switch S3.

The other end of the switch S1 is connected to all of the other ends of the switch group SA2–SAn connected to the capacitors C2A through CnA and further to one end of the switch S5. The other end of the switch S5 is connected to the other end of the switch S4 and further to all of the other ends of the switch group SB2–SBn connected to the capacitors C2B through CnB.

The other ends of the capacitors C2A through CnA which are not connected to the switch group SWG are all connected to one end of the capacitor C1A and the normal phase input terminal of the operational amplifier AMP. Likewise, the other ends of the capacitors C2B through CnB which are not connected to the switch group SBn are all connected to one end of the capacitor C1B at the inverted phase input terminal of the operational amplifier AMP.

The other end of the capacitor C1A is connected to one end of each of the switch S2 and the switch S6; the other end of the capacitor C1B is connected to one end of each of the switch S3 and the switch S7.

The other end of the switch S6 is connected to the normal-phase output terminal of the operational amplifier AMP, one end of the switch S8, and the output terminal OUT1. The other end of the switch S7 is connected to the inverted-phase output terminal of the operational amplifier AMP, the other end of the switch S8, and the output terminal OUT2.

The normal-phase input terminal of the operational amplifier AMP is connected to one end of the switch S9. The other end of the switch S9 is connected to the input terminal IN5. Also, the inverted phase input terminal of the operational amplifier AMP is connected to one end of the switch S10. The other end of the switch S10 is also connected to the input terminal IN5.

Furthermore, the signal lines whereon the amplification rate selection signal (GCTL) from the input terminal IN4 is supplied are connected to all the gates of the switch group SA2–SAn and SB2–SBn.

The operation of the sample-hold circuit 24 is explained hereinbelow while referring to the circuit diagram in FIG. 3 and the timing charts shown in FIGS. 4A through 4G.

When the sampling clock ö takes a high level, the switches S1, S2, S3, S4, S8, S9, and S10 in the circuit diagram in FIG. 3 become on. Because the clock ö[overbar], of the clock ö inverted, is supplied to the gates of the switches S5, S6, and S7, these switches become off went the sampling clock ö takes the high level.

At this moment, the ends of the capacitors C1A and C1B are connected to the input terminal IN3 through the switch S2 and S3 respectively. Accordingly, the voltage at one end of the capacitors C1A and C1B becomes the common mode voltage (CM) that is the central potential in the analog/digital conversion range applied to the input terminal IN3. Meanwhile, the other ends of the capacitors C1A and C1B are connected to each of the input terminals of the operational amplifier AMP. Assuming the properties of the operational amplifier to be ideal, those two input terminals are regarded as imaginally shorted together and therefore the other ends of the capacitors C1A and C1B become the same potential.

It is now to be understood that those capacitors for which the switch group SAn and SBn connected serially to each capacitor becomes on among the capacitors C2A through CnA and the capacitors C2B through CnB are capacitors which are selected by the amplification rate selection signal (GCTL) so that the switched capacitor amplifying circuit achieves the prescribed amplification rate.

Accordingly, one end of each capacitor selected from among the capacitors C2A through CnA is connected through the SAn and SBn and switch S1 to the input terminal IN1. Likewise, one end of each capacitor selected from among the capacitors C2B through CnB connected through each of the SAn and SBn and switch S4 to the input terminal IN2. Accordingly, those capacitors selected from the capacitors C2A through CnA and the capacitors C2B through CnB are charged to VIN(+) or VIN(−), which are the voltages of the input video signals complementary to each other.

In this instance, it is to be understood that a capacitor provided at the input side of the amplifier AMP is selectively made effective when a switch corresponding to the capacitor is closed to connect the capacitor to the amplifier.

Furthermore, the two output terminals of the operational amplifier AMP are shorted by the switch S8 and held at the common mode voltage (CM) by the common mode feedback circuit, not shown. Likewise, the two input terminals of the operational amplifier AMP are also held at the common mode voltage (CM) by the switch S9 and switch S10.

The state in the proceeding explanation wherein an instance á appears when the sampling clock ö takes a high level in the timing charts in FIGS. 4A through 4G.

Figure 4A:
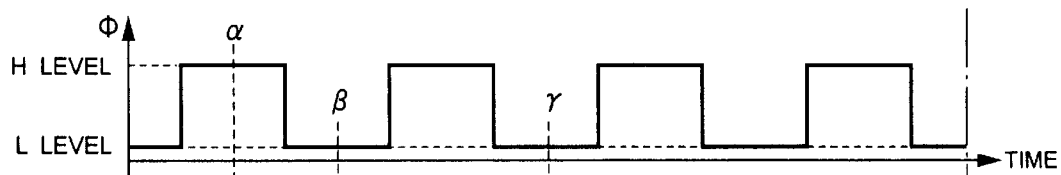
FIGS. 4A through 4G are timing charts showing the control sequence in the chopper-type sample-hold circuit shown in FIG. 3.
Figure 4B:
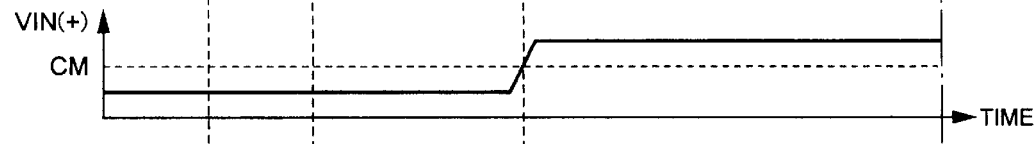
Figure 4C:
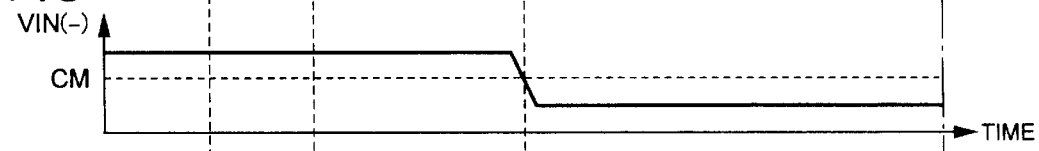

FIG. 4A shows the sampling clock ö, FIGS. 4B and 4C show the voltages of VIN(+) and VIN(−) which are the input signals to the input terminals IN1 and IN2 which are complementary to each other. These complementary input signals are the video signals output from the preceding low pass filter 22 and may take on various values, changing over time according to the prescribed video signal format. In the example shown in FIG. 4B, a signal waveform is assumed wherein VIN(+) is a voltage lower than the common mode voltage (CM) before the time á and becomes a voltage greater than the common mode voltage (CM) after the passage of time á. Moreover, VIN(−) shown in FIG. 4C has a waveform that is simply the inverse of VIN(+).

Figure 4D:
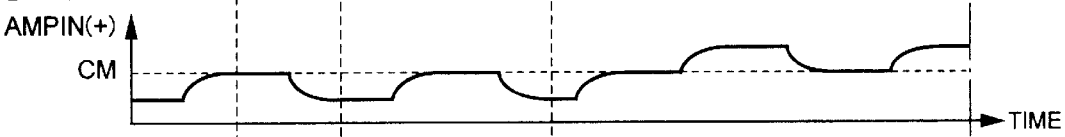
Figure 4E:
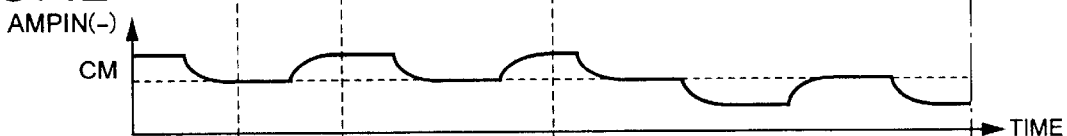
Figure 4F:
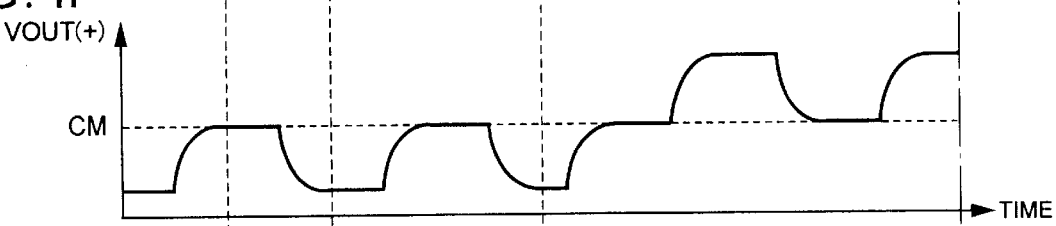
Figure 4G:
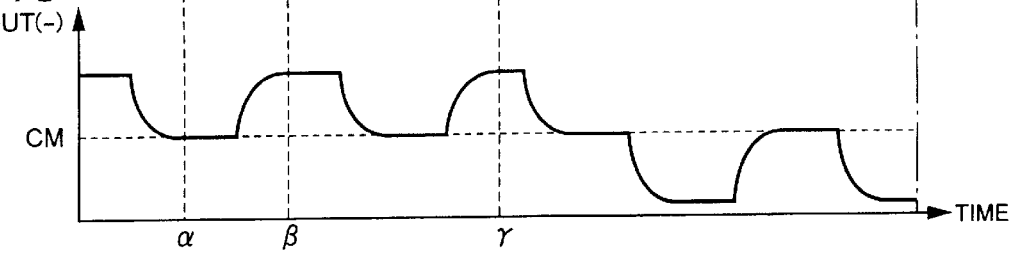

FIGS. 4F and 4G show the voltages of the VOUT(+) and VOUT(−) which are the output signals appearing at the output terminals OUT1 and OUT2. Furthermore, FIGS. 4D and 4E show the AMPIN(+) which is the voltage of the normal-phase input terminal and AMPIN(−) which is the voltage of the inverse-phase input terminal of the operational amplifier.

As discussed above, at an instance á when ö is at a high level, the voltages of AMPIN(+), AMPIN(−), VOUT(+), and VOUT(−) all become the common mode voltage (CM) because of the operation of the respective switches.

Next, it is assumed that the sampling clock ö has become low level. In this case, the switches S1, S2, S3, S4, S8, S9, and S10 in the circuit in FIG. 3 become off and the switches S5, S6, and S7 become on.

As a result, from among the capacitors C2A through CnA and the capacitors C2B through CnB, the input terminal side electrode of the capacitors selected by the amplification rate selection signal (GCTL) are shorted by the switch S5. As discussed above, the capacitors C2A through CnA are charged to VIN(+) which is the input signal voltage applied to the input terminal IN1. Meanwhile, the capacitors C2B through CnB are charged to VIN(−) which is the input signal voltage applied to the input terminal IN2. Accordingly, the mid-point voltage between VIN(+) and VIN(−) appears between the input terminal side electrodes of the capacitors shorted by the switch S5.

Consequently, such complementary input voltages VIN (+) and VIN(−) become the inputs for the amplifier, assuming a switched capacitor amplifier comprising a dual input operational amplifier AMP, input side capacitors C2A through CnA (C2B through CnB), and a feedback side capacitor C1A (C1B). The input voltages VIN(+) and VIN (−) are amplified at the prescribed amplification rate and an output voltage appears between VOUT(+) and VOUT(−) which are the output terminals of the operational amplifier AMP.

When the value of the output voltage is defined as the voltage difference between VOUT(+) and VOUT(−), the amplification rate A can be expressed with the following formula according to the properties of the switched capacitor amplifier discussed above.

$$A=(VOUT(+)-VOUT(-))/(VIN(+)-VIN(-))= [C2+C3+ \ldots +Cn]_{sel}/C1$$

In this formula, $[C2+C3+ \ldots +Cn]_{sel}$ means an operator which is the sum of the capacitances of the capacitors, selected by the amplification rate selection signal (GCTL) from the capacitors C2A through CnA (C2B through CnB).

In effect, in the circuit shown in FIG. 3, the amplification rate for the video signal is freely adjusted by appropriately establishing the capacitances of the capacitors C2A through CnA (C2B through CnB) and appropriately selecting the connected capacitances by the amplification rate selection signal (GCTL).

When, especially, the total capacitance of the capacitors C2A–CnA(2B–CnB) is made equal to or smaller than the capacitance of the capacitor C1A(C1B), the amplification A does never exceed 1. Under such condition, the analog input signal circuit of the present invention makes possible to supply the conventional stand video signal or DVD signal having amplitude voltage equal to or larger than 1.3V to an A/D converter of pipeline type.

The state wherein the sampling clock ö is at a low level as explained above is shown, and this is an instance â in the timing charts in FIGS. 4A through 4G. In this drawing, the voltages of the input signals AMPIN(+) and AMPIN(−) are shown in FIGS. 4D and 4E and the signals amplified at the above-mentioned amplification rate A become VOUT(+) and VOUT(−), which are the output signals shown in FIGS. 4F and 4G respectively.

The sample-hold circuit 24 holds the voltages VOUT(+) and VOUT(−) at such a time. The analog/digital converter 25 then performs analog/digital conversion of these held voltages.

The clamping voltage generating circuit 26 is explained hereinbelow. This circuit is a circuit for generating the clamp setting voltage (VRCL) corresponding to the amplification rate selection signal (GCTL) establishing the amplification rate of the switched capacitor amplifier in the sample-hold circuit 24.

For the sake of the explanation of this circuit, the amplitude of the input video signal (VIN), meaning the transitional amplitude from peak to peak in the signal wave form, is assumed to be 0.5 V, for example. Also, the conversion range of the analog input voltage of the analog/digital converter 25 (hereinafter, simply "conversion range") is assumed to be from 1.0 V to 2.0 V.

In this case, the common mode voltage (CM) showing the central or midpoint potential of the conversion range of the analog/digital converter 25 becomes 1.5 V. The amplification process in the above-mentioned sample-hold circuit 24 is then carried out with the common mode voltage (CM) as the center. Accordingly, the input video signal (VIN) to the sample-hold circuit 24 is preferably a varied signal having the 1.5 V direct current voltage as the center. Also, in order to perform the appropriate. analog/digital conversion operation, it is necessary that the value of A, the amplification rate of the sample-hold circuit 24, multiplied by the difference between the input signal and the common mode voltage (CM) fall within the conversion range.

In order to fit this numerical example, the amplitude of the input video signal (VIN) is equal to 0.5 V and the conversion range of the analog/digital converter 25 is a range of 1.0 V to 2.0 V, and therefore it is preferable that the amplification rate A be A=2. Also, the input signal of the analog/digital converter 25 is preferably the signal waveform with the maximum value of 2.0 V and minimum value of 1.0 V, wherein the 1.5 V direct current voltage is the center. Consequently, the input signal of the sample-hold circuit 24 satisfies such conditions if it has a signal waveform with a maximum value of 1.75 V and minimum value of 1.25 V, wherein the 1.5 V direct current voltage is the center.

In other words, the clamping circuit 21 works to clamp the input video signal (VIN) with the prescribed clamp setting voltage (VRCL) and keep appropriate the signal wave form.

For example, in the case of clamping at the leading level of the synchronizing signal included in the input video signal (VIN), meaning the synch tip level that is the minimum level of the video signal, the 1.25 V which is the minimum value of the abovementioned signal waveform becomes the clamp setting voltage (VRCL). The clamping voltage generating circuit 26 generates the clamp setting voltage (VRCL) based on the amplification rate selected signal (GCTL) and supplies this to the clamping circuit 21.

For example, the clamping voltage generating circuit 26 comprises a digital/analog converting circuit (hereinafter, simply "D/A converting circuit"), a memory circuit, and a microcomputer for controlling these (none of these is shown). Information, such as information relating to the clamping operation in the clamping circuit 21, such as carrying out clamping at the pedestal level or synch tip level, and the conversion range of the analog/digital converter 25, is stored in the memory circuit.

When the amplification rate selecting signal (GCTL) is input from the control circuit, not shown, to the clamping voltage generating circuit 26, the above-mentioned microcomputer calculates the amplification rate in the sample-hold circuit 24 from this signal. Furthermore, this microcomputer adds the conversion range of the analog/digital converter 25 and the operating conditions of the clamping circuit 21 stored in the memory circuit, and calculates the optimum clamp setting voltage and supplies this to the D/A converting circuit. The D/A converting circuit converts this digital value to an analog direct current voltage, generates the clamp setting voltage (VRCL), and supplies this to the clamping circuit 21.

Moreover, the clamping voltage generating circuit 26 is not limited to the above-mentioned constitution. For example, a D/A converting circuit may be established in the clamping circuit 21, and only the digital signal showing the clamp setting voltage (VRCL) output from the clamping voltage generating circuit 26 to the clamping circuit 21.

Figure 5:
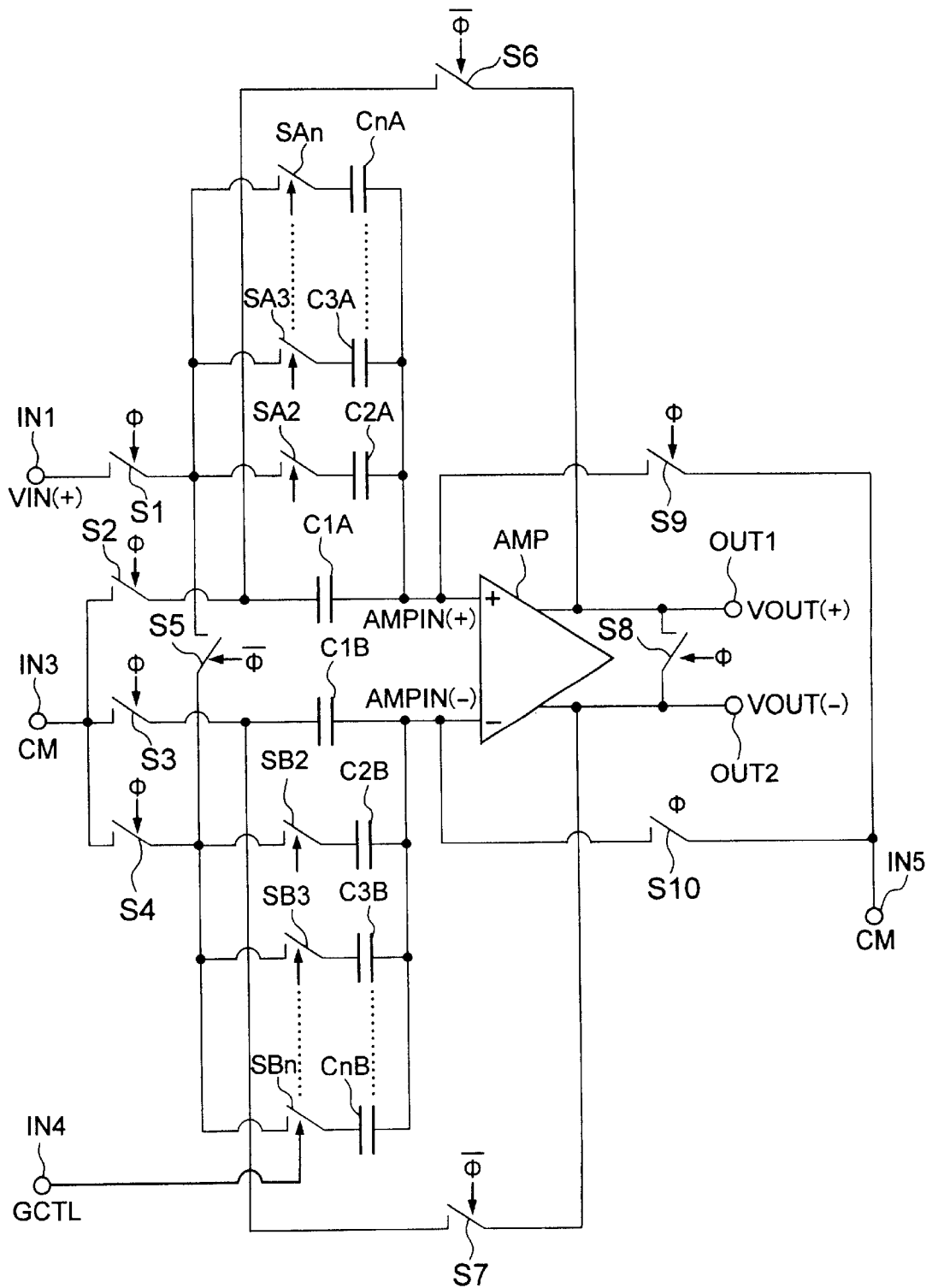
FIG. 5 is a circuit diagram in the case where a single input amplifying circuit is used as the chopper-type sample-hold circuit in the embodiment shown in FIG. 2.

The present invention is not limited to the embodiments discussed above and may also use a sample-hold circuit, with the so-called single input system, as shown in FIG. 5 as the sample-hold circuit 24. In addition, the circuit shown in FIG. 5 is different only with regards to being connected to the input terminals IN2 and IN3 in the circuit shown in FIG. 3 and these being common mode voltage (CM) input terminals. An explanation thereof is accordingly omitted.

In the present embodiment, in the switched capacitor amplifier in the sample-hold circuit 24, the constitution is such that the input side capacitors are variable as means for adjusting the amplification rate, but the present invention is not limited to such a constitution. In other words, the constitution may also be such that in the circuit diagrams shown in FIG. 2 or 5, the input side capacitors C2A through CnA (C2B through CnB) are fixed and the feedback side capacitor C1A (C1B) is varied by the amplification rate selection signal (GCTL).

In the present embodiment, the explanation was made while using an analog/digital converting circuit for video signal processing, but the present invention is not limited to such a case. Needless to say, it may be used an analog signal input circuit, treating an analog signal such as an audio signal.

As discussed in detail above, the present invention makes possible the provision of an analog input circuit which can freely adjust the amplification rate, even when one or less, and generate the appropriate and stable clamping voltage corresponding to that amplification rate.

What is claimed is:

1. An analog signal input circuit comprising:

a clamping circuit for clamping the amplitude of an input analog signal to a clamp voltage corresponding to a clamping voltage setting signal;

a sample-hold circuit for amplifying an output signal issued from said clamping circuit at a sample amplification rate and sample-holding the amplified signal; and an analog/digital converter for generating a digital signal representing the amplitude of the output signal from said sample-hold circuit;

wherein said sample-hold circuit includes a switched capacitor amplifier which is provided with a plurality of capacitors, connected with a switch group for which the opening and closing is controlled according to an amplification rate setting command, as input side capacitors or feedback side capacitors, and said sample amplification rate is established according to the capacitance ratio of said input side capacitors and said feedback side capacitors on the basis of said setting command; and wherein said clamping circuit adjusts said clamp voltage in accordance with said setting command so that the central value of the amplitude of the output signal from said sample-hold circuit becomes the central voltage in the conversion range of said analog/digital converter.

2. The analog signal input circuit according to claim 1, wherein a plurality of capacitors connected with a switch group for which the opening and closing is controlled according to said setting command is used as the input side capacitors of said switched capacitor amplifier.

3. The analog signal input circuit according to claim 1, wherein a plurality of capacitors connected with a switch group for which the opening and closing is controlled according to said setting command is used as the feedback side capacitors of said switched capacitor amplifier.

4. The analog signal input circuit according to claim 1, wherein a dual input/output differential amplifying circuit is used as said switched capacitor amplifier.

5. The analog signal input circuit according to claim 1, wherein a single input differential amplifying circuit is used as said switched capacitor amplifier.

6. The analog signal input circuit according to claim 1, wherein said analog signal is an analog video signal.

7. An analog signal input circuit comprising:

a clamping circuit for clamping the amplitude of an input analog signal to a clamp voltage corresponding to a clamping voltage setting signal;

a sample-hold circuit including a switched capacitor amplifier for amplifying an output signal issued from said clamping circuit at a sample amplification rate and sample-holding the amplified signal; and an analog/digital converter for generating a digital signal representing the amplitude of the output signal from said sample-hold circuit, said switched capacitor amplifier including an input passage having a plurality of input side capacitors which are selectively made effective in response to a setting command representing said sample amplification rate, and a feedback passage having a feedback capacitor, and said clamp circuit adjusting said clamp voltage in accordance with said setting command so that the central value of the amplitude of the output signal from said sample-hold circuit becomes the central voltage in the conversion range of said analog/digital converter.

8. The analog signal input circuit according to claim 7, in which a total capacitance of those of said plurality of input capacitors is equal to or smaller than that of said feed-back side capacitors.

9. The analog signal input circuit according to claim 8, in which said input passage includes a plurality of switch circuits each having one terminal connected to the output of said clamp circuit and the other terminal connected to the input side capacitor, said switch circuits become selectively conductive in response to said setting command.

10. A signal input circuit comprising:

a clamp circuit for receiving an input signal having a given amplitude and for clamping said input signal at a clamp voltage in response to a clamp voltage setting signal;

an amplifying circuit for amplifying the output signal from said clamp circuit at an amplifying rate, said amplifying circuit including a first node receiving the output signal from said clamp circuit, a plurality of first switches which are selectively made conductive in response to a setting command representing an amplifying rate and each of which has one terminal connected to said first node, a plurality of first capacitors each having one terminal thereof connected to the other terminal of a corresponding one of said first switches, a second capacitor having one terminal thereof connected to the other terminals of said first capacitor, and an operational amplifier having one input terminal thereof connected to the one terminal of said second capacitor and an output terminal thereof connected to the other terminal of said second capacitor;

an analog/digital converter for converting the output signal from said amplifying circuit into a digital signal; and a clamp voltage setting signal generating circuit for generating said clamp voltage setting signal in response to said setting command so that the central value of the amplitude of the output signal from said amplifying circuit coincides with the central voltage in the conversion range of said analog/digital converter.

11. The signal input circuit according to claim 10, wherein said amplifying circuit further including:

a second node receiving an output signal from said claim circuit;

a plurality of second switches each having one terminal thereof connected to said second node and becoming selectively conductive in response to a setting command representing an amplifying rate;

a plurality of third capacitors each having one terminal thereof connected to the other terminal of the corresponding one of said second switches; and a fourth capacitor having one terminal thereof connected to the other terminals of said third capacitors, and wherein said operational amplifying circuit further having a second input terminal which is connected with the other terminal of said fourth capacitor and a second output terminal which is connected to the other terminal of said fourth capacitor.

12. The signal input circuit according to claim 11, which further comprises common potential supply means for supplying a common potential to the other terminal of said second capacitor and the other terminal of said fourth capacitor.

13. The signal input circuit according to claim 12, which further includes a fourth switch having one terminal thereof connected to said one terminal of each one of said first switches and the other terminal thereof connected to said one terminal of each one of said third switch.

14. The signal input circuit according to claim 11, which further includes a common potential supply means for supplying a common potential to the one terminal of said second capacitor and the one terminal of said fourth capacitor.

* * * * *